United States Patent
deVilliers

(10) Patent No.: US 10,998,244 B2
(45) Date of Patent: May 4, 2021

(54) SYSTEM AND METHOD FOR TEMPERATURE CONTROL IN PLASMA PROCESSING SYSTEM

(71) Applicant: Tokyo Electron Limited, Tokyo (JP)

(72) Inventor: Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/164,263

(22) Filed: Oct. 18, 2018

(65) Prior Publication Data
US 2019/0051568 A1 Feb. 14, 2019

Related U.S. Application Data

(62) Division of application No. 15/466,520, filed on Mar. 22, 2017, now Pat. No. 10,147,655.

(Continued)

(51) Int. Cl.
*H01J 37/32* (2006.01)
*C23C 16/46* (2006.01)
(Continued)

(52) U.S. Cl.
CPC .......... *H01L 22/26* (2013.01); *C23C 16/047* (2013.01); *C23C 16/458* (2013.01); *C23C 16/46* (2013.01);
(Continued)

(58) Field of Classification Search
CPC ........ B01J 19/08; B01J 19/081; B01J 19/085; B01J 2219/08; B01J 2219/0879;
(Continued)

(56) References Cited

U.S. PATENT DOCUMENTS 6,059,922 A 5/2000 Yamazaki et al.
6,171,641 B1 * 1/2001 Okamoto .............. C23C 14/541
427/8

(Continued)

FOREIGN PATENT DOCUMENTS

CN 1802733 A 7/2006
JP H9-162131 A 6/1997
WO WO 2008/033928 A2 3/2008

OTHER PUBLICATIONS

Office Action dated Apr. 17, 2020 in Chinese Patent Application No. 201780031279.1 with English translation.

(Continued)

*Primary Examiner* — Edward Chin
(74) *Attorney, Agent, or Firm* — Oblon, McClelland, Maier & Neustadt, L.L.P.

(57) ABSTRACT

Techniques herein include systems and methods for fine control of temperature distribution across a substrate. Such techniques can be used to provide uniform spatial temperature distribution, or a biased spatial temperature distribution to improve plasma processing of substrates and/or correct characteristics of a given substrate. Embodiments include a plasma processing system with temperature control. Temperature control systems herein include a primary heating mechanism to heat a substrate, and a secondary heating mechanism that precisely modifies spatial temperature distribution across a substrate being processed. At least one heating mechanism includes a digital projection system configured to project a pattern of electromagnetic radiation onto or into a substrate, or through the substrate and onto a substrate support assembly. The digital projection system is configured to spatially and dynamically adjust the pattern of electromagnetic radiation and selectively augment heating of the substrate by each projected point location.

16 Claims, 5 Drawing Sheets

Related U.S. Application Data

(60) Provisional application No. 62/311,571, filed on Mar. 22, 2016.

(51) Int. Cl.
| | |
|---|---|
| H01L 21/67 | (2006.01) |
| C23C 16/48 | (2006.01) |
| C23C 16/511 | (2006.01) |
| C23C 16/458 | (2006.01) |
| C23C 16/50 | (2006.01) |
| H01L 21/3065 | (2006.01) |
| H01L 21/683 | (2006.01) |
| H01L 21/66 | (2006.01) |
| C23C 16/04 | (2006.01) |

(52) U.S. Cl.
CPC ............ *C23C 16/481* (2013.01); *C23C 16/50* (2013.01); *C23C 16/511* (2013.01); *H01J 37/3244* (2013.01); *H01J 37/32339* (2013.01); *H01J 37/32715* (2013.01); *H01J 37/32724* (2013.01); *H01L 21/3065* (2013.01); *H01L 21/67069* (2013.01); *H01L 21/67103* (2013.01); *H01L 21/67115* (2013.01); *H01L 21/67248* (2013.01); *H01L 21/6833* (2013.01); *H01J 2237/334* (2013.01); *H01J 2237/3321* (2013.01)

(58) Field of Classification Search
CPC ......... H01L 21/02164; H01L 21/02211; H01L 21/02238; H01L 21/02252; H01L 21/02255; H01L 21/02271; H01L 21/0228; H01L 21/30604; H01L 21/30625; H01L 21/67069; H01L 21/6708; H01L 21/67109; H01L 21/67248; H01L 22/12; H01L 22/20
See application file for complete search history.

(56) References Cited

U.S. PATENT DOCUMENTS

| | | | |
|---|---|---|---|
| 6,427,621 B1 * | 8/2002 | Ikegawa | H01J 37/32266 118/723 MW |
| 7,938,081 B2 | 5/2011 | Chen et al. | |
| 7,998,307 B2 | 8/2011 | Chen et al. | |
| 9,006,116 B2 * | 4/2015 | Terasaki | C23C 16/45525 438/787 |
| 9,700,868 B2 * | 7/2017 | Medoff | C10L 1/04 |
| 2004/0121598 A1 * | 6/2004 | Achutharaman | H01L 21/30604 438/689 |
| 2008/0017613 A1 * | 1/2008 | Nogami | H01L 21/67069 216/58 |
| 2008/0032066 A1 * | 2/2008 | Stiblert | G03F 7/70391 427/595 |
| 2009/0118872 A1 * | 5/2009 | Nonaka | G05D 23/1934 700/285 |
| 2010/0252412 A1 | 10/2010 | Tian et al. | |
| 2010/0267173 A1 * | 10/2010 | Moffatt | B23K 26/127 438/16 |
| 2011/0204045 A1 * | 8/2011 | Moffatt | B23K 26/0738 219/678 |
| 2011/0220288 A1 | 9/2011 | Kobayashi et al. | |
| 2012/0229783 A1 * | 9/2012 | Nienhuys | G03F 7/70933 355/30 |
| 2013/0259763 A1 * | 10/2013 | Kawarada | B01J 19/126 422/186.29 |
| 2015/0147827 A1 * | 5/2015 | deVilliers | H01L 21/67248 438/7 |

OTHER PUBLICATIONS

Office Action dated Dec. 11, 2020 in corresponding Chinese Patent Application No. 201780031279.1 (without English Translation)
Written Opinion dated Jul. 3, 2017 in PCT/US2017/023635, filed Mar. 22, 2017 22 pp.
Notification of Examination Opinions dated Mar. 26, 2018 in corr. Taiwanese Patent App. No. 106109462, filed Mar. 22, 2017 (w/ English translation ) 45 pp.

* cited by examiner

US 10,998,244 B2

SYSTEM AND METHOD FOR TEMPERATURE CONTROL IN PLASMA PROCESSING SYSTEM

CROSS REFERENCE TO RELATED APPLICATIONS

The present application is a Divisional of U.S. patent application Ser. No. 15/466,520, filed Mar. 22, 2017, which claims the benefit of U.S. Provisional Patent Application No. 62/311,571, filed on Mar. 22, 2016, entitled "System and Method for Temperature Control in Plasma Processing System," which is incorporated herein by reference in its entirety.

BACKGROUND OF THE INVENTION

This disclosure relates to plasma processing systems.

Fabrication of integrated circuits (IC) in the semiconductor industry typically employs plasma processing to create and assist surface chemistry necessary to remove material from and deposit material to a substrate within a plasma processing chamber. Examples of plasma processing apparatus include a plasma CVD (Chemical Vapor Deposition) apparatus configured to deposit a thin film on a substrate, and a plasma etching apparatus configured to remove material from a substrate, which can include using an etch mask to define locations for removing material. In general, such plasma processing apparatus form plasma under vacuum conditions by flowing a process gas into a processing chamber and heating electrons to energies sufficient to sustain ionizing collisions. Moreover, the heated electrons can have energy sufficient to sustain dissociative collisions and, therefore, a specific set of gases under predetermined conditions (e.g., chamber pressure, gas flow rate, etc.) are chosen to produce a population of charged species and/or chemically reactive species suitable to a particular process being performed within the chamber (e.g., etching processes where materials are removed from the substrate or deposition processes where materials are added to the substrate).

SUMMARY

Temperature control of a substrate being processing within a plasma processing system affects the uniformity of a given plasma process being performed on the substrate. For example, local differences in temperature of the substrate can create local differences in etch rate or deposition rate across the substrate, which results in non-uniform etching or deposition. Being able to accurately control temperature distribution during plasma processing can result in high precision processing on the working surface of the substrate, thereby successfully completing steps (etching holes, forming films, etc.) for fabricating semiconductor devices.

Substrates are typically clamped to a substrate holder using an electrostatic chuck (ESC). The electrostatic chuck electrostatically attracts the substrate by applying a voltage to a chuck electrode. Some electrostatic chucks have embedded heaters so that the surface temperature of the electrostatic chuck may be rapidly changed through heat generation by the heaters. For example, multiple heaters can be embedded within the substrate holder and divided into two or more zones that are independently controllable. Temperature control can then be implemented using these heating zones. Nevertheless, even with dozens of individual heaters, temperature control can be difficult, especially since features being etched are many orders of magnitude smaller than areas of individual heaters on or embedded within the electrostatic chuck.

Techniques herein include systems and methods for fine control of temperature distribution across a substrate in a plasma processing system. One embodiment includes a plasma processing system with temperature control. This plasma processing system includes a processing chamber, a gas delivery system configured to deliver one or more process gasses to a substrate processing region of the processing chamber, and a substrate support assembly configured to support a substrate in the substrate processing region during plasma processing. A plasma generator is coupled to the processing chamber and configured to generate plasma in the substrate processing region. A first heating mechanism is positioned within the substrate support assembly and configured to heat a substrate when supported on the substrate support assembly. A second heating mechanism comprises a digital projection system configured to project a pattern of electromagnetic radiation through the substrate and onto the substrate support assembly. The digital projection system is configured to spatially and dynamically adjust the pattern of electromagnetic radiation. The digital projection system is configured to project the pattern of electromagnetic radiation within a predetermined wavelength range of electromagnetic radiation that passes through semiconductor material as transparent. The substrate support assembly comprises an absorption material that absorbs electromagnetic radiation within the predetermined wavelength range to spatially and selectively augment heating of the substrate by each projected point location.

Another embodiment includes a method for processing a substrate. This method includes identifying a critical dimension signature of a substrate, positioning the substrate on a support assembly within a plasma processing chamber, heating the substrate using a first heating mechanism positioned within the substrate support assembly during a plasma etching or deposition process, and modifying a spatial temperature profile of the substrate support assembly by projecting a pattern of infrared light through the substrate and onto the substrate support assembly. The pattern of infrared light is projected by a digital projection system configured to spatially and dynamically adjust the pattern of infrared light based on the critical dimension signature.

Accordingly, such temperature control can provide uniform temperature control or provide a bias temperature profile such as to correct non-uniform critical dimensions during an etch or deposition process.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques herein include systems and methods for fine control of temperature distribution across a substrate. Such techniques can be used to provide uniform spatial temperature distribution, or a biased spatial temperature distribution to improve plasma processing of substrates, such as semiconductor wafers, and/or to correct characteristics of a given substrate. One embodiment includes a plasma processing system with temperature control. Temperature control systems herein include a primary heating mechanism to heat a substrate, and a secondary heating mechanism that precisely modifies spatial temperature distribution across a substrate being processed. This temperature modification can include indirectly modifying substrate temperatures by modifying spatial temperature of a substrate support assembly, or directly modifying an internal temperature or surface temperature of a substrate.

Figure 1:
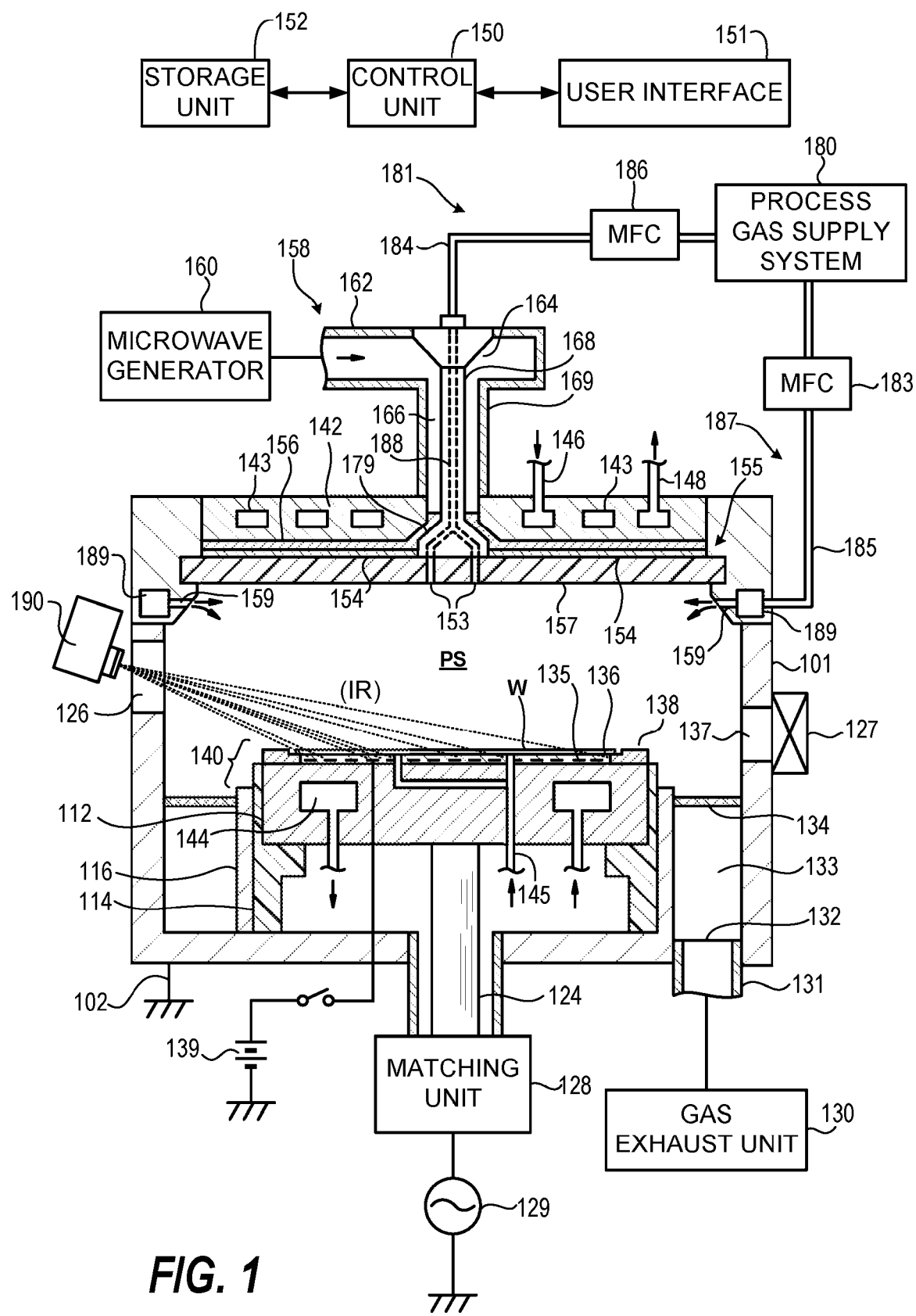
FIG. 1 is a cross-sectional schematic view of an example plasma processing system as described herein.

Referring now to FIG. 1, a schematic cross-sectional view of a microwave plasma processing apparatus with temperature control is illustrated in accordance with embodiments herein. Note that for convenience in describing embodiments, reference will primarily be made to a microwave plasma processing system. Techniques herein, however, can be similarly embodied in any other type of plasma processing system, such as inductively-coupled plasma systems, capacitively-coupled plasma systems, and other conventional plasma processing systems. In other words, the heating and heat modification techniques herein can be applied to any of these plasma processing systems.

Plasma processing systems herein include a processing chamber 101. The processing chamber 101 defines a processing vessel providing a process space PS for plasma generation. Typical plasma processes in semiconductor manufacturing benefit from low pressures or vacuum conditions. Thus, processing chamber 101 can provide a process space sufficient to support atmospheric or vacuum conditions. A gas delivery system is configured to deliver one or more process gasses to a substrate processing region of the processing chamber 101. For example, process gas supply system 180 can deliver one or more gasses to process space PS. A plasma generator is coupled to the processing chamber 101 and configured to generate plasma in the substrate processing region. For example, plasma can be generated by coupling radio frequency power to process gases delivered to the process space PS.

A substrate support assembly 140 is configured to support a substrate in the substrate processing region during plasma processing. A substrate support assembly can include any of support pins, an electrostatic chuck, a susceptor, etc. A first heating mechanism is positioned within the substrate support assembly 140 and configured to heat the substrate W when supported on the substrate support assembly 140. For example, one or more resistive heaters or heating elements can be included within susceptor 112 to provide heat electrically. In some embodiments, heating elements can be arranged in zones such as concentric zones or grid-based zones. The first heating mechanism can also include a fluid circulator that circulates fluid within the substrate support assembly to help maintain a desired temperature. The first heating mechanism supplies heat to the substrate by contact with the substrate support assembly 140, and/or by a heat transfer gas. Some plasma processing systems maintain a gap between a given substrate and a support assembly and rely on gas (such as helium) flowed within the gap to transfer heat from the substrate support assembly 140 to substrate W.

The plasma processing system herein includes a second heating mechanism. The second heating mechanism comprises a digital projection system 190 configured to project a pattern of electromagnetic radiation through the substrate W and onto the substrate support assembly 140. The digital projection system is configured to spatially and dynamically adjust the pattern of electromagnetic radiation being projected. The digital projection system 190 is configured to project the pattern of electromagnetic radiation within a predetermined wavelength range of electromagnetic radiation that passes through semiconductor material as transparent. The substrate support assembly 140 can include an absorption material that absorbs electromagnetic radiation within the predetermined wavelength range to spatially and selectively augment heating of the substrate W by each projected point location. Alternatively, the substrate support assembly 140 is selected of a material that absorbs such electromagnetic radiation. For example, the digital projection system 190 can project an image through the substrate W using a laser galvanometer, grating light valve, digital light process (DLP) chip, and so forth. The image can be projected line-by-line with scanning type projections, or all at once with DLP type image projections. The digital projection system 190 can access substrate W via window 126. Note that any optical steering device can be used that is configured to deliver location-specific intensities from a given light source, and be able to dynamically change light intensities at any given location within a projectable area. To name a few examples, such additional devices can include an acoustic optical modulator, a microelectromechanical (MEM) mirror, pneumatically controlled systems or piezoelectric systems.

The predetermined wavelength range of electromagnetic radiation can be infrared (IR) radiation. For example, an infrared range can be light of 1080 nanometers wavelengths to 3 micron wavelengths. This particular range can be referred to as long wave IR. As can be appreciated, such digital projections (image projections) can create more than one hundred temperature adjustment regions per centimeter squared of the substrate support assembly. A given number of adjustment regions per unit area is based on a resolution of a given DLP chip or width/diameter of a given laser beam and galvanometer combination. Accordingly, as higher resolution projection systems are selected, finer temperature control is achieved.

Figure 2:
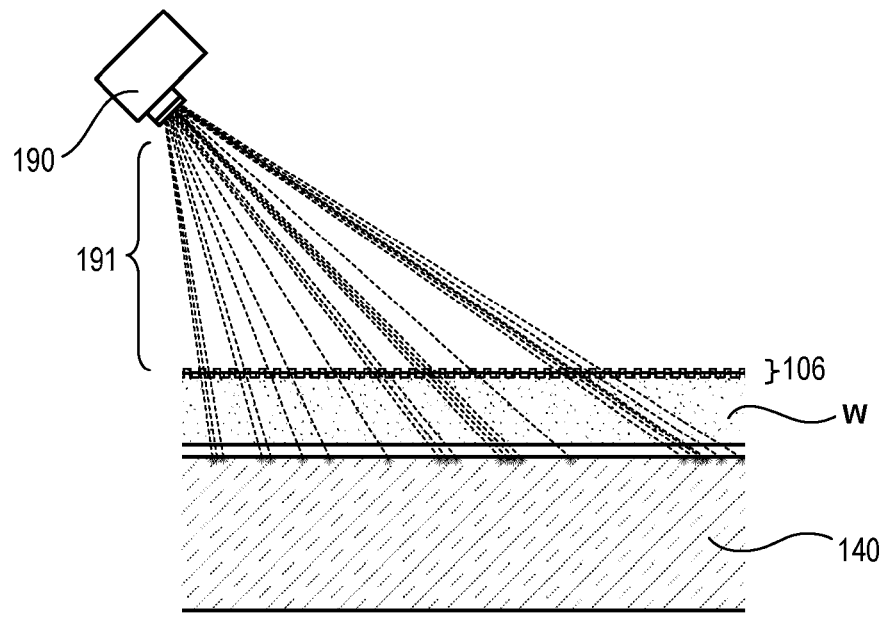
FIG. 2 is a cross-sectional schematic view of a substrate segment showing temperature control according to embodiments disclosed herein.

Referring now to FIG. 2, a cross-sectional schematic view of a substrate segment illustrates the digital projection system 190 heating the substrate support assembly 140. Note that digital projection system 190 projects light pattern 191 through the substrate W and onto the substrate support assembly 140. Accordingly, energy carried by light pattern 191 passes through substrate W as transparent (or largely transparent) in that the substrate W is transparent to particular wavelengths being projected (or transparent to a majority of wavelengths being projected). Projected energy, after passing through the substrate W, is then transferred into the substrate support assembly 140 as heat. Certain wavelengths can pass through certain materials as transparent. For example, substrates (wafers) in semiconductor manufacturing are typically made of silicon. Silicon is largely transparent to long wave IR. In other words, IR having wavelengths greater than a predetermined length will quantum mechanically tunnel through silicon material of the substrate and then dump its energy into a substrate support (such as a chuck) positioned beneath the substrate. In other words, some IR will travel at a same angle through silicon material as its projection angle, and then dissipate its energy into a chuck beneath the substrate in a cascade of vibration transitions Typical semiconductor substrates are primarily comprised of silicon, with devices 106 on a working surface of substrate W. Devices 106 can include transistors, capacitors, etc., that are in various stages of fabrication. For substrate and systems configuration in which some heat is absorbed by the substrate W or devices 106 on the wafer, projected IR light can be modulated and demodulated by location. For example, if a given substrate pattern is particularly dense at a given location on the substrate and thus absorbing more light than at other locations on the wafer, then light intensity at that location can be dropped to compensate for heat signature. Then the heat signature can be adjusted after making calibrations that address pattern density. The pattern of projected radiation then becomes a calibration systematic.

Using IR radiation is compatible with plasma processing systems because IR is not energetic enough to interact with (or significantly interact with) plasma and plasma products. If heat is absorbed by the wafer or devices on the wafer in a particular setup, then the system can modulate and demodulate by location. If the pattern is particularly dense at a given location on the substrate and absorbing more light than at other locations on the wafer, then light intensity at that location can be lessened to compensate for heat signature. Note that the system can still adjust a given heat signature when done making elected calibrations. Accordingly, a projected pattern then becomes a calibration systematic.

Figure 3:
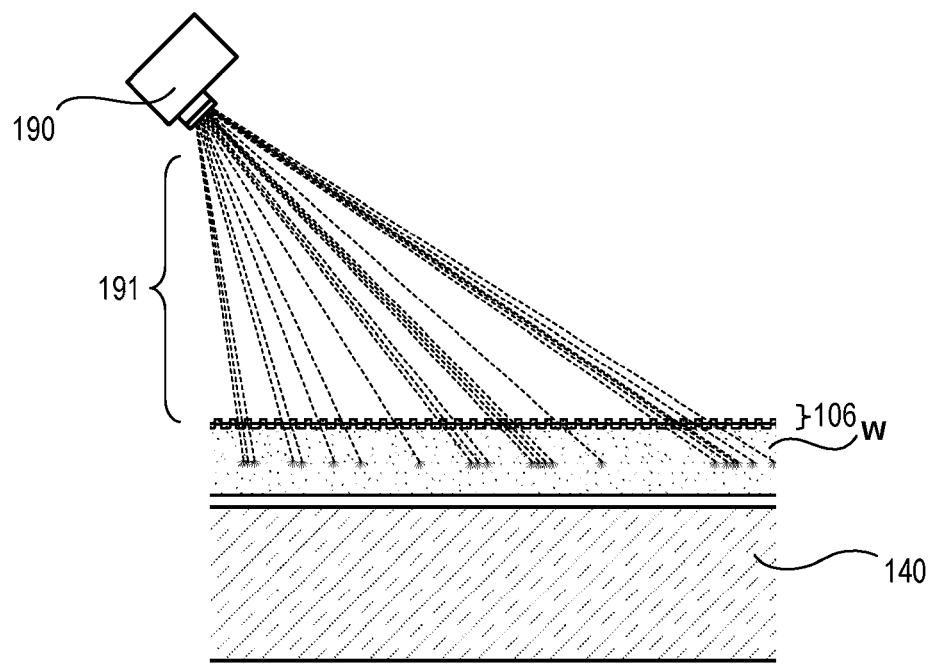
FIG. 3 is a cross-sectional schematic view of a substrate segment showing temperature control according to embodiments disclosed herein.

As wavelengths of project light get shorter, the probably of interaction with the substrate increases until most of the projected light is absorbed within the substrate W. FIG. 3 illustrates this result. Then as wavelengths continue to shorten, projected light is absorbed by devices 106 of substrate W. When devices 106 are relatively thin (such as an initial layer of transistors prior to any metallization) IR can easily pass through devices 106. As device thickness increases then the amount of IR that passes through the substrate lessens. Thus, techniques herein can interact with the chuck, substrate, or devices (wafer surface). If it is desired to transfer heat to the substrate directly, then a shorter IR wavelength is used. If it is desired to transfer heat to the substrate support assembly or chuck, then a sufficiently long wavelength is select so that incident angle is not a concern because projected light will tunnel through the substrate. For example, using far infrared of about 1080 nanometers to 3 microns will tunnel past silicon. Selecting wavelengths of about 750-800 nanometers can transfer heat into silicon, and then light wavelengths of approximately 750 nanometers to around 250 nanometers can be used to transfer heat into devices on a working surface of the substrate.

Thus, the digital projection system 190 can be configured to project a pattern of electromagnetic radiation through micro-fabricated structures on a working surface of the substrate and into silicon material of the substrate. Accordingly, the digital projection system can be configured to project the pattern of electromagnetic radiation within a predetermined wavelength range of electromagnetic radiation that passes through micro-fabricated structures (such as devices 106) on the substrate as transparent. The substrate—having silicon below the micro-fabricated structures—then absorbs electromagnetic radiation within the predetermined wavelength range to spatially and selectively augment heating of the substrate by each projected point location. Such a range can include 750-800 nanometers of IR light.

As can be seen in FIGS. 2 and 3, light pattern 191 is not necessarily projected uniformly, but more or less light is projected at various locations across the substrate support assembly 140. Such projection control—including which point locations receive projected light and how much light each point location receives—enables precise temperature control. One challenge with temperature control is providing uniform temperature. Conventional systems may provide multiple heating zones, but such conventional system typically provide only a hundred or so temperature zones. This means that for each chip or die, there can nevertheless exist substantial temperature variations within each die.

Another challenge is addressing non-uniform critical dimensions (CDs) of incoming substrates to be processed. A given substrate may have already experienced multiple different fabrication processes resulting in a pattern to be transferred that has CD values that vary across the working surface of the substrate. During a given etching (or deposition) process, such non-uniform CD values can be corrected by spatially controlled temperature variations to affect more or less etching/deposition at different locations across the substrate because a given etch rate can increase or decrease with temperature changes. This can include creating hundreds or thousands of temperature variations per die or chip. Thus, the digital projection system can be configured to project the pattern of electromagnetic radiation, based on a critical dimension signature of the substrate. Such a projection can create or continue a CD bias, or correct non-uniform CD values.

Other embodiments include configurations for projecting light into or within a plasma processing chamber. Different types of plasma reactors can have different heights of process spaces. For example, some plasma reactors may have 80 millimeters or less of clearance, while other plasma reactors can have 150 millimeters of clearance or more. This clearance refers to a vertical distance between a given substrate being processed and an upper electrode or showerhead surface. For plasma systems with limited clearance, various embodiments can be used to project through an entire surface of a substrate.

Figure 4:
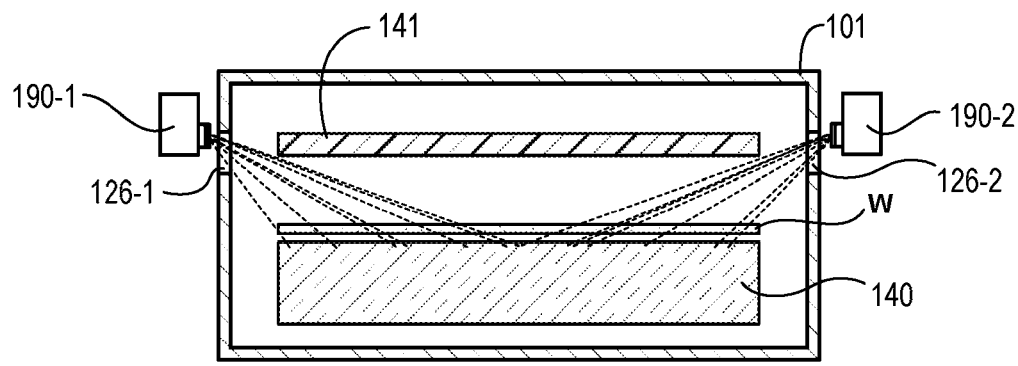
FIG. 4 is a cross-sectional schematic view of a plasma processing system according to embodiments disclosed herein.
Figure 5:
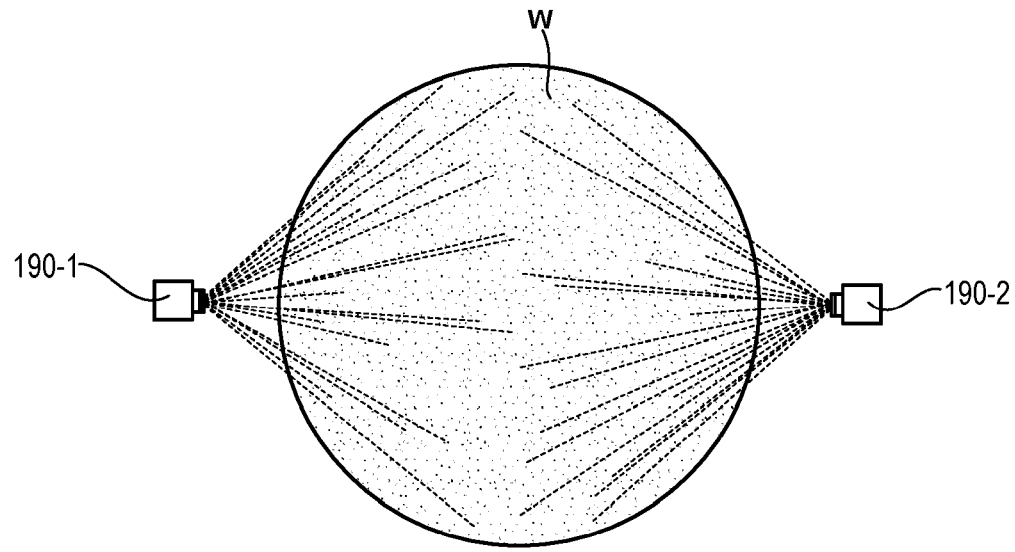
FIG. 5 is a top view of a substrate showing temperature control according to embodiments disclosed herein.

For example, FIG. 4 is a cross-sectional schematic view of a plasma processing system that includes two digital projection systems. The plasma processing system of FIG. 4 includes window 126-1 and window 126-2. Many conventional plasma processing chambers include one or more windows. Such windows are often used for diagnostic purposes and/or to measure light properties emitted by plasma within. Such windows can be used herein for the second heating mechanism. One embodiment includes a digital projection system 190-1 on one side of the processing chamber 101 and configured to project through window 126-1, while a digital projection system 190-2 on another side of the processing chamber 101 is configured to project through window 126-2. Note that process space ceiling 141 can prevent full projection or prevent a desired minimum angle of projection towards substrate support assembly 140. Accordingly, each digital projection system 190 is configured to project to only a portion of the substrate through corresponding windows. FIG. 5 is a top view of substrate W (without processing chamber 101 or process space ceiling 141) that shows digital projection system 190-1 and digital projection system 190-2 each providing spatially-selective heat modification for one half of substrate W. Thus, light can be projected through two or more windows. Accordingly, through each window the digital projection system is configured to have a line-of-sight of at least half of the substrate or a portion of the substrate.

Figure 6:
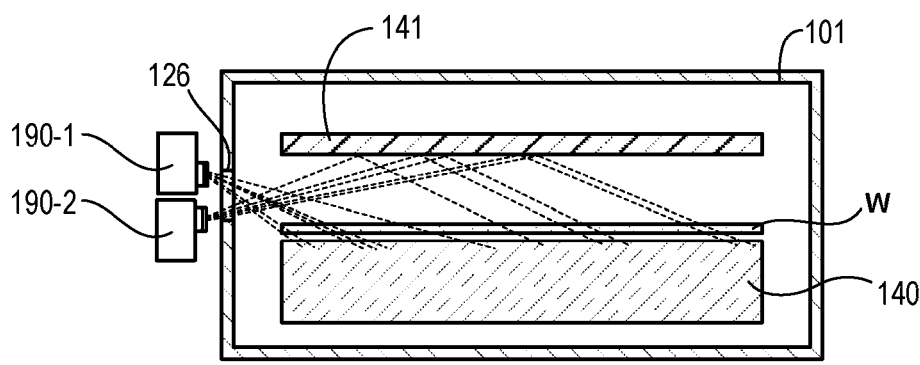
FIG. 6 is a cross-sectional schematic view of a plasma processing system according to embodiments disclosed herein.

In other embodiments, a single window can be used for multiple projection origins. For example, in FIG. 6, digital projection system 190-1 is configured to directly project through substrate W onto substrate support assembly 140 via window 126. Digital projection system 190-2 is configured to project light toward process space ceiling 141, which functions as a reflection surface (being positioned opposite the substrate) that reflects electromagnetic radiation onto a remaining portion of the substrate support assembly. In other embodiments, windows can be placed on a ceiling of a given processing chamber. Windows herein do not need to be transparent to visible light, but can be made of materials that are at least transparent to IR. For example, yttrium oxide can be used as a window material.

Figure 7:
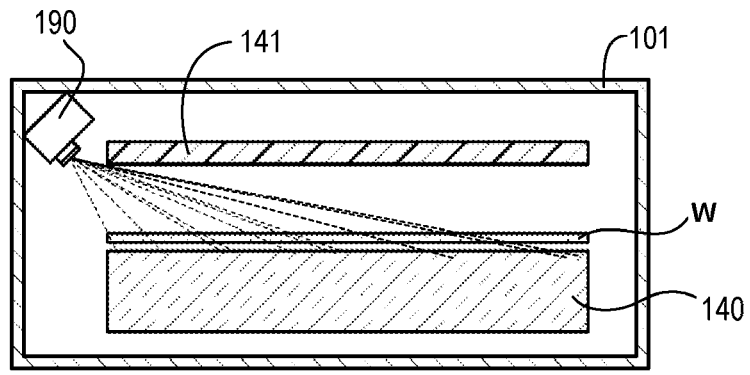
FIG. 7 is a cross-sectional schematic view of a plasma processing system according to embodiments disclosed herein.
Figure 8:
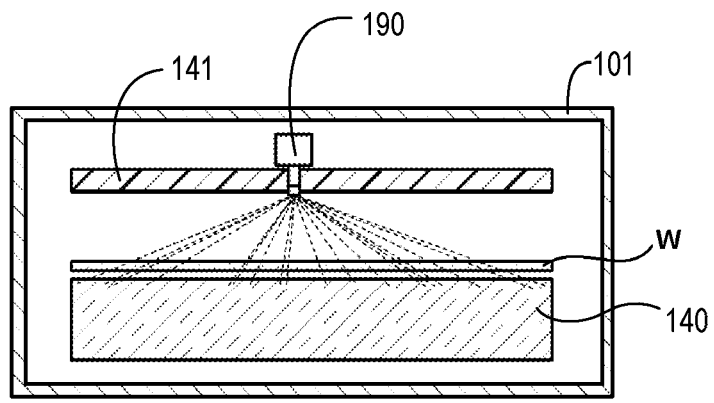
FIG. 8 is a cross-sectional schematic view of a plasma processing system according to embodiments disclosed herein.

In other embodiments, the digital projection system 190, or components thereof, can be mounted within the processing chamber 101, as shown in FIG. 7. Positioning can be sufficient for one digital projection system to project onto an entire surface of the substrate support assembly, or a portion of the substrate support assembly. In other embodiments, the digital projection system can project IR from within the process space ceiling 141, such as within a showerhead assembly, as shown in FIG. 8. Such an assembly can permit placement of a projection point at a central location within the processing chamber 101. Note that the digital projection system 190 is not required to be mounted within the processing chamber 101, but one or more fold mirrors or other small optical components within a shower head can be used to direct IR from a remote IR source.

Figure 9:
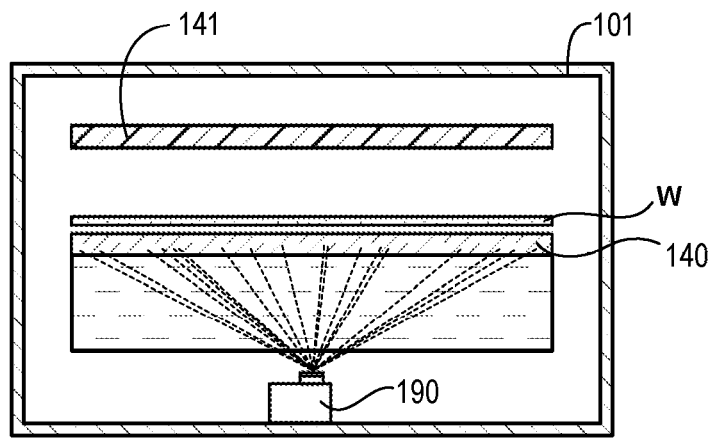
FIG. 9 is a cross-sectional schematic view of a plasma processing system according to embodiments disclosed herein.

Another embodiment shown in FIG. 9 can include projecting IR from beneath substrate support assembly 140. For such a configuration, it is beneficial to have an IR transparent material for most of the substrate support assembly 140 and then an IR absorption material on a surface close to the substrate W. Thus, a window or cavity can be positioned below or within a lower electrode to enable projected IR to reach an absorption surface. In other embodiments, most of a given chuck can be comprised of silicon, but with a fluorescent coating on an upper surface of the chuck to absorb IR. Other materials such as calcium fluoride, high-grade quartz, and various ceramics can be transparent to IR. Materials can be selected to help control thermal expansion.

Figure 10:
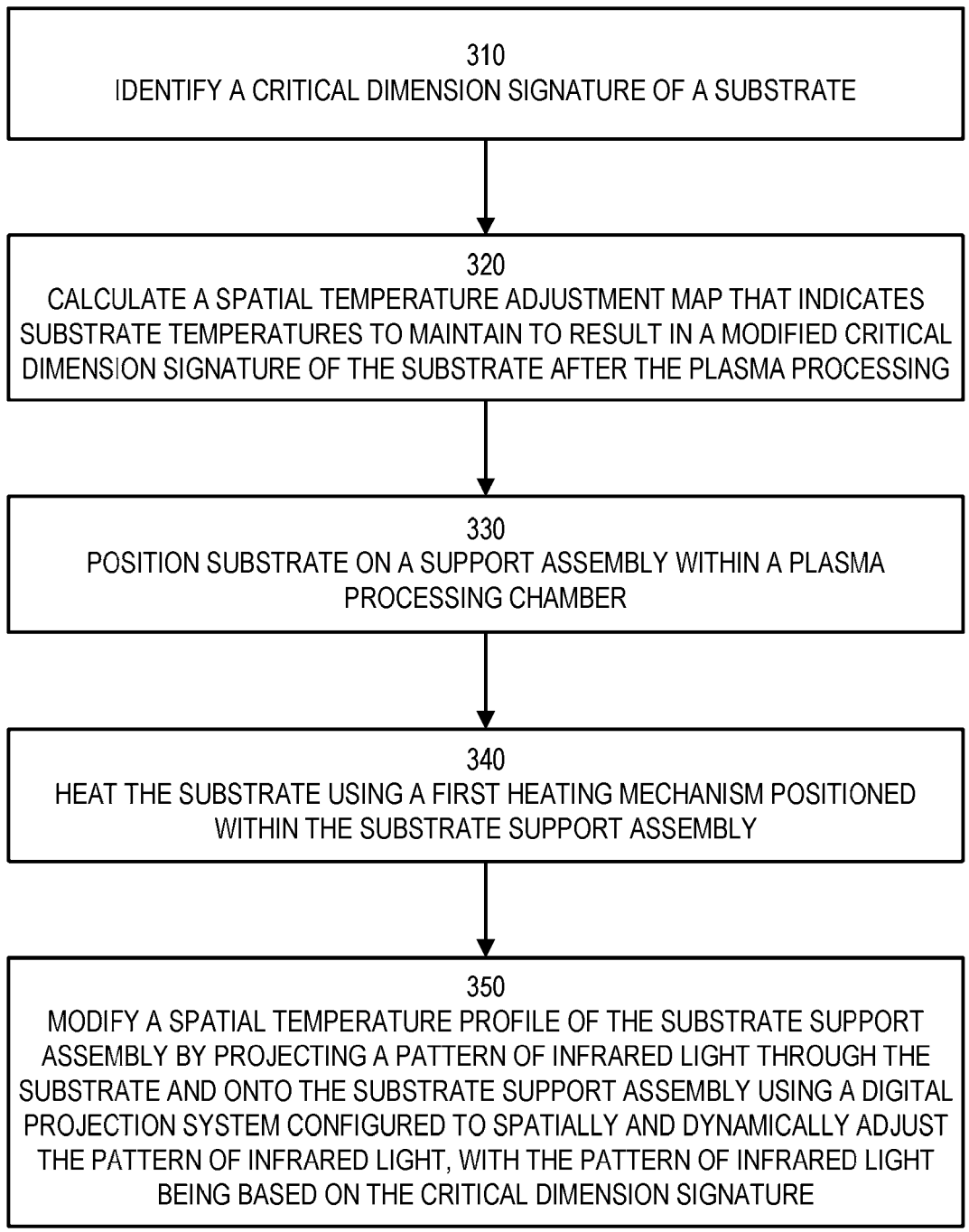
FIG. 10 is flow chart showing an example process according to embodiments disclosed herein.

Other embodiments herein include methods for plasma processing a substrate with precise temperature control. FIG. 10 is a flow chart that illustrates one such example flow. In step 310, a critical dimension signature of a substrate is identified. This critical dimension signature can be identified while a substrate is within a given plasma processing system, or prior to transporting the substrate into the plasma processing system. The critical dimension signature can be identified by measuring the substrate itself, or from measurements of a collection of substrates. The critical dimension signature can represent CD values across the substrate. For example, identifying the critical dimension signature can include creating a map that spatially identifies critical dimension values on a working surface of the substrate. The critical dimension values can include absolute measurements, or relative differences or deviations of CD values or compared to an average CD value.

In step 320, a spatial temperature adjustment map is calculated that indicates substrate temperatures to maintain (target temperatures) that result in a modified critical dimension signature of the substrate after the plasma etching (or deposition) process. For example, if a given substrate to be processed has a critical dimension signature with non-uniform CD values. The spatial temperature adjustment map can then indicate locations and target temperatures of the substrate support assembly or substrate to maintain to result in more or less etching at point locations so that the substrate (after plasma processing) has uniform CDs. In other embodiments, the spatial temperature adjustment map can indicate temperature modifications necessary to create uniform heating across the substrate. Typically it is difficult for heaters within the substrate support assembly to maintain accurate temperatures across the substrate. With high resolution adjustment herein, however, substrate temperatures can be made uniform with relatively little variance across the substrate.

In step 330, the substrate is positioned on a support assembly within a plasma processing chamber. In other words, a wafer can be mounted on a chuck so that it is held securely. In step 340, the substrate is heated using a first heating mechanism positioned within the substrate support assembly. This heating of the substrate occurs during a plasma etching or deposition process. This heating can include resistive heating using multiple zones and/or heaters, which can be independently controlled.

In step 350, a spatial temperature profile of the substrate support assembly is modified by projecting a pattern of infrared light through the substrate and onto the substrate support assembly. The substrate support assembly can be comprised of an absorption material that absorbs infrared light. The pattern of infrared light is projected by a digital projection system configured to spatially and dynamically adjust the pattern of infrared light. The pattern of infrared light being based on the critical dimension signature. In other words, in contrast to a photomask type of patterned light projection, the projection herein is dynamically adjustable or configurable by instructions. For example, a laser galvanometer or DLP chip can be used to project IR. The projected pattern can be configured prior to a plasma process and be essentially a static projection (same amount of IR and intensity at each point location), or the projection can dynamically change in response to temperatures fluctuations due to changing properties of a given plasma.

In some embodiments, basing the pattern of infrared light on the critical dimension signature can include modifying the spatial temperature profile using the spatial temperature adjustment map. The modified critical dimension signature can have less differences in critical dimension values as compared to the critical dimension signature of the substrate prior to the plasma etching or deposition process. Modifying the spatial temperature profile can include modifying the spatial temperature profile by each projected point location. Each projected point location corresponding to an image resolution of the digital projection system. In other words, for a given unit area of the substrate support assembly (such as a square centimeter), there can be hundreds of projected point locations. Thus, modifying the spatial temperature profile can include creating local temperature differences at point locations having an area less than a square centimeter, or having an area less than a square millimeter. A given area or resolution of creating local temperature differences depends on where electromagnetic radiation is received.

For embodiments in which heat is transferred into the chuck or substrate holder, temperature differences can be created having a width or diameter that is about the thickness of a given substrate being processed. Although radiation projected into the chuck can have a high resolution (such as a micron width laser beam), because of thermal diffusion or thermal blurring, point locations of controllable temperature change can be limited to a larger area, such as about a square millimeter or a thickness of a given substrate being processed. For embodiments in which heat is transferred directly into a substrate itself (instead of into the chuck to be diffused back to the substrate) or directly into devices on a substrate, temperature point locations can be controlled to less than a thickness of the substrate and thus have a higher resolution. Likewise, for embodiments in which projected radiation is targeted at plasma itself to spatially modify plasma temperature and/or radical production, heat control in such an embodiment can have a higher resolution.

In other embodiments, projecting the pattern of infrared light through the substrate and onto the substrate support assembly can include projecting the pattern of infrared light through a window of the plasma processing chamber. This window is transparent to infrared light or transparent to a particular type of light being projected. Projection can be executed from two or more projection locations such as by using two laser galvanometers at different locations.

In another embodiment, modifying the spatial temperature profile of the substrate includes projecting the pattern of infrared light through the micro-fabricated devices and into an interior region of the substrate comprised of silicon such that the silicon absorbs heat energy from the infrared light. Thus, heating the substrate can be augmented by directly modifying temperatures within a substrate being processed. In other words, a substrate material (such as silicon) becomes the target for delivering heat energy, with a wavelength of projected electromagnetic radiation selected to be absorbed by, for example, a substrate lattice structure.

Another embodiment includes a method for processing a substrate by manipulating plasma characteristics directly. A substrate is positioned on a support assembly within a plasma processing chamber. The substrate is heated either by using a first or second heating mechanism. The first heating mechanism is positioned within the substrate support assembly and configured to heat the substrate during a plasma etching or deposition process. A second heating mechanism is a digital projection system configured to project a pattern of electromagnetic radiation into or through the substrate with dynamic control of the projected pattern. Plasma is generated within the plasma processing chamber. The plasma is spatially modified by projecting a pattern of electromagnetic radiation into the plasma. The pattern of electromagnetic radiation is projected by a digital projection system configured to spatially and dynamically adjust the pattern of electromagnetic radiation. In other words, a given light steering device herein can be used to provide additional heat into the plasma itself, such as to affect equilibrium rates. Plasma is an equilibrium reaction, and so techniques herein increase radical products from one species to another species as a function of an equilibrium state of the plasma. Such techniques can, for example, generate more energetic radicals of a specific type. Projected electromagnetic radiation can be tuned to react with specific gasses supplied to the processing chamber as part of a process gas mixture. Tuning electromagnetic radiation for plasma interaction involves selecting, in general, radiation of shorter wavelengths because longer wavelength radiation typically passes through plasma without significant interaction.

This selective plasma augmentation technique enables plasma modification control by location for spatial plasma adjustment. Such spatial plasma adjustment (either for radical generation or plasma temperature modification) can provide plasma uniformity or a particular plasma signature that benefits a substrate being processed. For example, plasma properties can be adjusted by location such as to assist with aspect ratio etching or deposition, cross substrate uniformity, iso-dense loading, etc. The pattern of electromagnetic radiation can be based on a critical dimension signature, a plasma uniformity signature, or other plasma parameters to create or correct.

Another embodiment includes a substrate heating system for plasma processing that uses a light-steering device for sole or primary heating of a substrate being processes. This system includes a processing chamber, a gas delivery system configured to deliver one or more process gasses to a substrate processing region of the processing chamber, a substrate support assembly configured to support a substrate in the substrate processing region during plasma processing, and a plasma generator coupled to the processing chamber and configured to generate plasma in the substrate processing region. Also included is a heating mechanism comprising a digital projection system configured to project a pattern of electromagnetic radiation through the substrate and onto the substrate support assembly. The digital projection system is configured to spatially and dynamically adjust the pattern of electromagnetic radiation. The digital projection system configured to project the pattern of electromagnetic radiation within a predetermined wavelength range of electromagnetic radiation that passes through semiconductor material as transparent. The substrate support assembly comprises an absorption material that absorbs electromagnetic radiation within the predetermined wavelength range of electromagnetic radiation to spatially and selectively heat the substrate by each projected point location. In other words, a high-energy radiation projection source (or multiple radiation projection sources) can be used as a sole or primary heating mechanism. For heat augmentation, an electromagnetic radiation source, such as a laser can provide up to about 5 degrees of temperature augmentation. For primary heating, however, a high-powered laser can be used sufficient to provide about 100 degrees Celsius of heating.

As described above, the digital projection system can be configured to project electromagnetic radiation onto a substrate support assembly, or directly into (or onto) the substrate itself and heat the substrate as the primary heating mechanism. Some embodiments can include multiple digital projection systems. One projections system can be relative high-powered to provide primary heat to a substrate, while a second digital projection system is comparatively lower-powered and can be used to modify heating. Note that a position of a given digital projection system or systems can result in electromagnetic radiation projections having a particular reflectance angle. A given digital projection system can compensate for this by calibration by changing a projection angle and/or increasing energy output to deliver sufficient heat.

Note that with embodiments herein, various radiative sources of energy can be used. For example, electromagnetic radiation including all different wavelengths of light, electron emission, alpha particles, etc. For light projection, embodiments can selectively use white light, UV, multiband, broadband tuned, or combinations thereof. For example, three colors or wavelengths of light can be spatially projected into a given plasma to react with certain species therein. Wavelengths of infrared can be selected that balance energy deliver potential with tunneling potential. For example, far-infrared light generally tunnels through silicon better than near-infrared, but near-infrared can more efficiently transfer heat into the substrate support assembly or the substrate. Thus, selecting short, medium or long infrared wavelengths can be based on a corresponding plasma and substrate through which to tunnel.

Returning now to FIG. 1, a more detailed description of an exemplary plasma processing system is described. The microwave plasma processing apparatus can be configured to perform plasma processing such as plasma etching, plasma enhanced chemical vapor deposition (PECVD), plasma enhanced atomic layer deposition (ALD), etc., via surface wave plasma excitation at microwave frequencies using, for example, plate-type slot antenna. Plasma processing can be executed within processing chamber 101, which can be a cylindrical vacuum chamber comprised of a machined or case metal, such as aluminum or stainless steel. The processing chamber 101 is electrically grounded using, for example, ground wire 102. The processing chamber 101 defines a processing vessel providing a process space PS for plasma generation. An inner wall of the processing vessel can be coated with a protective barrier, such as alumina, yttria, or other protectant.

At a lower, central area within the processing chamber 101, a susceptor 112 (which can be disc-shaped) can serve as a mounting table on which, for example, a substrate W to be processed (such as a semiconductor wafer) can be mounted. Substrate W can be moved into the processing chamber 101 through loading/unloading port 137 and gate valve 127. An electrostatic chuck 136 is provided on a top surface of the susceptor 112. Clamp electrode 135 is electrically connected to DC (direct current) power source 139. The electrostatic chuck 136 attracts the substrate W thereto via an electrostatic force generated when a DC voltage from the DC power source 139 is applied to the clamp electrode 135 so that substrate W is securely mounted on the susceptor 112.

A high-frequency power source 129 for applying a RF (radio frequency) bias is electrically connected to the susceptor 112, or bias electrode through an impedance matching unit 128 (to match impedance or minimize reflected power) and a power feeding rod 124. The high-frequency power source 129 can output a high-frequency voltage in a range from, for example, 0.2 MHz to 20 MHz, e.g., 13.56 MHz. Applying a high frequency bias power attracts ions, generated by the plasma in the processing chamber 101, to substrate W. High-frequency power source 129 can include a signal generator and amplifier for modulating the amplitude and power output from the high-frequency power source 129 according to the modulation cycle described above. A focus ring 138 is provided radially outside the electrostatic chuck 136 to surround the substrate W.

A coolant flow path 144 can extend, for example, in a circumferential direction, within susceptor 112 and can be configured to receive circulated coolant to assist with controlling a processing temperature of substrate W on the electrostatic chuck 136. Additionally, a heat transfer gas from a heat transfer gas supply unit (not illustrated) can be supplied to a space between a top surface of the electrostatic chuck 136 and a rear surface of the substrate W through a gas supply line 145.

An exhaust path 133 can be formed along an outer periphery of support unit 114 and/or conductive support unit 116 and an inner wall of the processing chamber 101 in which an annular baffle plate 134 is attached to the top or inlet of the exhaust path 133 and an exhaust port 132 (or multiple exhaust ports), which is provided in a bottom portion of the exhaust path 133. A gas exhaust unit 130 is connected to each exhaust port 132 through gas exhaust line 131, which can have multiple exhaust lines. The gas exhaust unit 130 can include a vacuum pump such as a turbo molecular pump configured to decompress the plasma processing space within the processing chamber 101 to a desired vacuum condition.

An upper portion of the example microwave plasma processing apparatus will now be described. A dielectric window 157 is arranged to seal an upper portion of the processing chamber 101, through which electromagnetic radiation at microwave frequencies can propagate to the process space PS. A space just below the dielectric window 157 within the processing chamber 101 serves as a plasma generation space as process space PS. The dielectric window 157 can be made of a microwave-permeable dielectric material, such as quartz or ceramic, including aluminum oxide, and can have a thickness of, for example, about 20 mm (millimeters) or sufficient thickness to mechanically resist the pressure difference between an interior of the processing chamber 101 and the ambient environment. The dielectric window 157 can be provided with a slot plate 154 which can be a conductor attached to, or disposed on, a top surface of the dielectric window 157. The slot plate 154 can have a plurality of slot pairs that are configured to irradiate microwaves distributed concentrically in a rotationally symmetric arrangement, though other geometric configurations can be used. On the slot plate 154, a dielectric plate 156 can shorten the wavelength of microwaves propagated inside the slot plate 154. The slot plate 154 is electromagnetically coupled to a microwave transmission line 158. A slot antenna 155, which can be a flat plate-type slot antenna, for example, or a disc-shaped, radial line slot antenna, can include the slot plate 154, the dielectric plate 156, and an antenna rear plate (not shown) provided to be opposite to the slot plate 154.

The microwave transmission line 158 is a line configured to propagate or transmit electromagnetic waves at microwave frequencies or other frequencies, for example, microwaves of 2.45 GHz, which are output from a microwave generator 160 at a predetermined power level, to the slot antenna 155. The microwave transmission line 158 can include a waveguide 162, a waveguide-coaxial line converter 164, and a coaxial line 166. The waveguide 162 can be, for example, a rectangular waveguide configured to transmit microwaves from the microwave generator 160 to the waveguide-coaxial line converter 164. The coaxial line 166 extends from the waveguide-coaxial line converter 164 to the central portion of the top of the processing chamber 101 and a terminal end of the coaxial line 166 is coupled to the slot antenna 155 through the dielectric plate 156. An outer conductor 169 and an inner conductor 168 can define a space for wave transmission. A connector unit 179 is connected to the lower end of the inner conductor 168.

In addition, as electromagnetic waves propagate radially through the dielectric plate 156, the wavelength shortens, and the wave mode transitions to plane waves of circular polarization having two orthogonal polarization components from each slot pair of the slot antenna 155 that are radiated toward the inside of the processing chamber 101. Process gas in the vicinity of the surface of the dielectric window 157 is then ionized by the electric fields of surface waves (microwave electric fields) propagated in the radial direction along the surface of the dielectric window 157 and, as a result, high-density and low-electronic temperature plasma is generated.

The dielectric plate 156 can include a cooling jacket plate 142, which can serve as an antenna rear plate to cover a top of the processing chamber 101. The cooling jacket plate 142 can be configured to absorb heat (radiating) of dielectric loss, which is generated from the dielectric window 157 and the dielectric plate 156. To provide cooling, a coolant can be circulated in a flow path 143, and fed and removed through conduit 146 and conduit 148.

The microwave plasma processing apparatus can include two routes for process gas introduction. Upper gas introduction section 181 includes a gas flow path provided in the dielectric window 157, and a side gas introduction section 187 that includes a gas flow path provided in a side wall of the processing chamber 101, as a gas introduction mechanism configured to introduce a processing gas into the processing chamber 101.

In the upper gas introduction section 181, a gas flow path 188 is provided in the inner conductor 168 of the coaxial line 166 to extend in an axial direction through the inside of the inner conductor 168. Additionally, a first gas supply line 184 from a process gas supply system 180 is connected to the upper end of the inner conductor 168 and the gas flow path 188 of the first gas supply line 184. The connector unit 179 can have a plurality of internal flow paths which are bored and radially branched from a common inlet. The connector unit 179 can be made of a conductor, and can be electrically grounded. The dielectric window 157 can be formed with inner flow paths connected to the terminal ends of a branched gas supply paths such as for process gas to vertically pass through the dielectric window 157 to face the plasma generation space within the processing chamber 101.

In the upper gas introduction section 181, a processing gas, which is communicated from the process gas supply system 180 at a predetermined pressure (for example, an etching gas or a film-forming gas), flows through the first gas supply line 184, the gas flow path 188 of the coaxial line 166, and is ejected from each gas jet port 153 at the terminal end. A mass flow controller (MFC) 186 and corresponding valve can be used for opening/closing and metering process gas flow in first gas supply line 184.

The side gas introduction section 187 is placed at a position lower than a bottom surface of the dielectric window 157, and can include a buffer chamber 189 (manifold), sidewall gas jet ports 159, and a second gas supply line 185 extending from the process gas supply system 180 to the buffer chamber 189. A mass flow controller 183 and corresponding valve can be used for opening/closing and metering process gas flow in second gas supply line 185. Process gas from side gas introduction section 187 can be jetted in a substantially horizontal flow from the respective sidewall gas jet ports 159 to be diffused in the process space PS.

Components of the plasma processing apparatus can be connected to, and controlled by, a control unit 150, which in turn can be connected to a corresponding storage unit 152 and user interface 151. Control unit 150 can include a microcomputer configured to control operation of each of the components within the microwave plasma processing apparatus such as, for example, the gas exhaust unit 130, the high-frequency power source 129, DC power source 139 for the electrostatic chuck 136, microwave generator 160, the upper gas introduction section 181, the side gas introduction section 187, the process gas supply system 180, a heat transfer gas supply unit (not illustrated), and the digital projection system 190, or the operations of the entire apparatus. Various plasma processing operations can be executed via the user interface 151, and various plasma processing recipes and operations can be stored in the storage unit 152. Accordingly, a given substrate can be processed within the plasma processing chamber with various microfabrication techniques.

Accordingly, such temperature control can provide uniform temperature control or provide a bias temperature profile such as to correct non-uniform critical dimensions during an etch process. Moreover, with digital light projection techniques, independently addressable heating control can be enabled for point locations having widths as small as a millimeter or substrate thickness.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for processing a substrate, the method comprising:
    identifying a critical dimension signature of a substrate;
    positioning the substrate on a substrate support assembly within a plasma processing chamber, the plasma processing chamber including a process space ceiling that is positioned over the substrate support assembly;
    heating the substrate using a first heating mechanism positioned within the substrate support assembly, heating the substrate occurring during a plasma etching or deposition process; and
    modifying a spatial temperature profile of the substrate support assembly by projecting a pattern of infrared light through the substrate and onto the substrate support assembly so that the pattern of infrared light is absorbed by an absorption material on a surface of the substrate support assembly close to the substrate, the pattern of infrared light being projected by a digital projection system that is arranged at a fixed position with respect to the substrate support assembly and configured to spatially and dynamically adjust the pattern of infrared light, the pattern of infrared light being guided by the process space ceiling towards the substrate support assembly, the pattern of infrared light being based on the critical dimension signature.

2. The method of claim 1, further comprising calculating a spatial temperature adjustment map that indicates substrate temperatures to maintain that result in a modified critical dimension signature of the substrate after the plasma etching or deposition process.

3. The method of claim 2, wherein the pattern of infrared light being based on the critical dimension signature includes modifying the spatial temperature profile using the spatial temperature adjustment map.

4. The method of claim 2, wherein the modified critical dimension signature has less differences in critical dimension values as compared to the critical dimension signature of the substrate prior to the plasma etching or deposition process.

5. The method of claim 1, wherein modifying the spatial temperature profile includes modifying the spatial temperature profile by each projected point location, each projected point location corresponding to an image resolution of the digital projection system.

6. The method of claim 1, wherein identifying the critical dimension signature includes creating a map that spatially identifies critical dimension values on a working surface of the substrate.

7. The method of claim 1, wherein the first heating mechanism is configured to heat the substrate using two or more independently controlled heating zones.

8. The method of claim 1, wherein modifying the spatial temperature profile includes creating local temperature differences at point locations having an area less than a square centimeter.

9. The method of claim 8, wherein modifying the spatial temperature profile includes creating local temperature differences at point locations having an area less than a square millimeter.

10. The method of claim 1, wherein projecting the pattern of infrared light through the substrate and onto the substrate support assembly includes projecting the pattern of infrared light through a window of the plasma processing chamber, the window being transparent to infrared light.

11. The method of claim 1, wherein projecting the pattern of infrared light through the substrate and onto the substrate support assembly includes projecting the pattern of infrared light from two or more projection locations.

12. A method for processing a substrate, the method comprising:
    identifying a critical dimension signature of a substrate;
    positioning the substrate on a substrate support assembly within a plasma processing chamber, the substrate comprised of silicon material and having micro-fabricated devices on a working surface of the substrate;
    heating the substrate using a first heating mechanism positioned within the substrate support assembly, heating the substrate occurring during a plasma etching or deposition process;
    modifying a spatial temperature profile of the substrate by projecting a pattern of infrared light through the micro-fabricated devices and into an interior region of the substrate such that the silicon material absorbs heat energy from infrared light, the pattern of infrared light being projected by a digital projection system that is arranged on a side of the plasma processing chamber and positioned at a side position with respect to the substrate support assembly and configured to spatially and dynamically adjust the pattern of infrared light, the pattern of infrared light being based on the critical dimension signature.

13. A method for processing a substrate, the method comprising:
    positioning a substrate on a substrate support assembly within a plasma processing chamber;
    heating the substrate using a first heating mechanism positioned within the substrate support assembly, heating the substrate occurring during a plasma etching or deposition process;
    generating plasma within the plasma processing chamber;
    spatially modifying a plasma reaction by projecting a pattern of electromagnetic radiation into the plasma, the pattern of electromagnetic radiation being projected by a digital projection system that is arranged on a side of the plasma processing chamber and positioned at a side position with respect to the substrate support assembly and configured to spatially and dynamically adjust the pattern of electromagnetic radiation.

14. The method of claim 13, wherein the pattern of electromagnetic radiation is based on a critical dimension signature.

15. The method of claim 13, wherein the pattern of electromagnetic radiation is based on a plasma uniformity signature.

16. The method of claim 1, wherein the fixed position comprises one of a position over the substrate support assembly, a position on a first side of the plasma processing chamber, or a position on a second side of the plasma processing chamber.

* * * * *